United States Patent [19]

Agatahama

[11] 4,355,291

[45] Oct. 19, 1982

[54] SEALED ELECTRIC ASSEMBLY WITH CONNECTING TERMINALS

[75] Inventor: Shunichi Agatahama, Osaka, Japan

[73] Assignee: Omron Tateisi Electronics Company, Kyoto, Japan

[21] Appl. No.: 233,706

[22] Filed: Feb. 12, 1981

[30] Foreign Application Priority Data

Feb. 26, 1980 [JP] Japan ................................. 55-23240
Feb. 26, 1980 [JP] Japan ................................. 55-23241
Dec. 10, 1980 [JP] Japan ................................. 55-175146

[51] Int. Cl.³ ............................................. H01H 9/04
[52] U.S. Cl. ................................... 335/128; 335/202; 174/52 S
[58] Field of Search .............. 335/128, 202; 174/52 S, 174/52 FP; 200/302, 303, 306; 361/331, 356, 357, 380, 417, 419, 426

[56] References Cited

U.S. PATENT DOCUMENTS

3,295,078 12/1966 Hrynewycz ...................... 335/128
3,987,383 10/1976 Antonitsch .
4,292,613 9/1981 Bando ............................... 335/128

*Primary Examiner*—G. P. Tolin
*Attorney, Agent, or Firm*—Wegner & Bretschneider

[57] ABSTRACT

Electric assembly including an insert-molded base member carrying connecting terminals, an electric block member mounted on the base member, and an upper cover fitted onto the base member to cover the electric block member, said base member comprising inner and outer walls which therebetween form an opening extending vertically through the entire thickness of the base member in such a manner that a lower portion of the upper cover and the terminals are exposed to the opening, said opening being filled with a sealant so that the upper cover, terminals and base member may be firmly secured together in position.

6 Claims, 7 Drawing Figures

SEALED ELECTRIC ASSEMBLY WITH CONNECTING TERMINALS

BRIEF SUMMARY OF THE INVENTION

The present invention relates to a sealed electric assembly having a plurality of external terminals for electrical connection, and more particularly to an improved electric assembly which includes an insert-molded base member carrying external terminals, an electric block member mounted onto the base member, and a cover fitted onto the base member to cover the electric block member.

It is well known that a miniature-size electric assembly, e.g., an electromagnetic relay, for installation on a printed circuit board is sealed with a sealant to prevent entry of foreign matter into the electric assembly. Particularly, a conventional sealed electric assembly comprises a plastic molded base carrying a plurality of connecting terminals, an electric block mounted on the base and a cover disposed on said base all integrally secured with a sealant externally filled in between said cover and base.

Such a conventional sealed electric assembly, however, has the disadvantage that during an assembling work, the soldering flux or the washing solvent tends to migrate into the enclosed electric block through the narrow clearance left over around each terminal within the molded base. In order to overcome this infiltration, the narrow clearance may be filled with a sealant in such a manner that each terminal at the base portion supported by the molded base is externally covered with a sealant. But it is a troublesome and difficult work to completely seal the cover, base and terminals with paste in a plurality of manual sealing processes.

It is, therefore, a primary object of the present invention to provide an electric assembly of which a plurality of joints are completely sealed by a simple and speedy sealing process.

It is a further object of the present invention to provide an electric assembly including a molded plastic base, connecting terminals inserted into the base and a cover fitted onto the base, all of which have been simultaneously secured in position with a sealant.

It is a still further object of the present invention to provide an electric assembly comprising a vent means for gasses evolved in a sealing operation, without defiling the ornamental appearance of the assembly.

Other objects and advantages of the present invention will become apparent from the following detailed description and the accompanying drawings.

DETAILED DESCRIPTION

Figure 1:
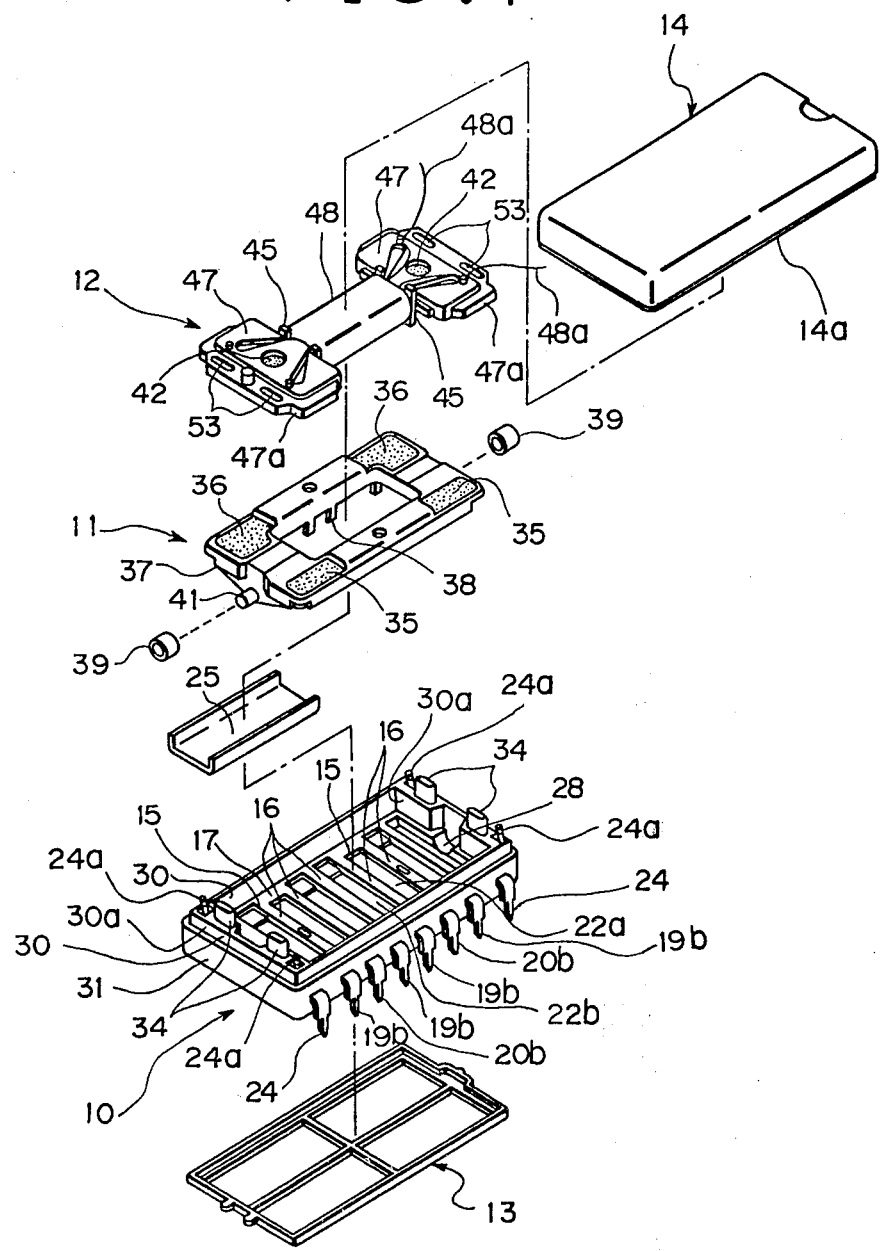
FIG. 1 is an exploded perspective view of an electromagnetic relay as an embodiment of the present invention.

Referring, now, to FIG. 1, there is shown an electromagnet relay as a preferred embodiment of the present invention. The relay includes a base member 10, an armature 11, an electromagnet 12, a lower cover 13, and an upper cover 14.

Figure 2:
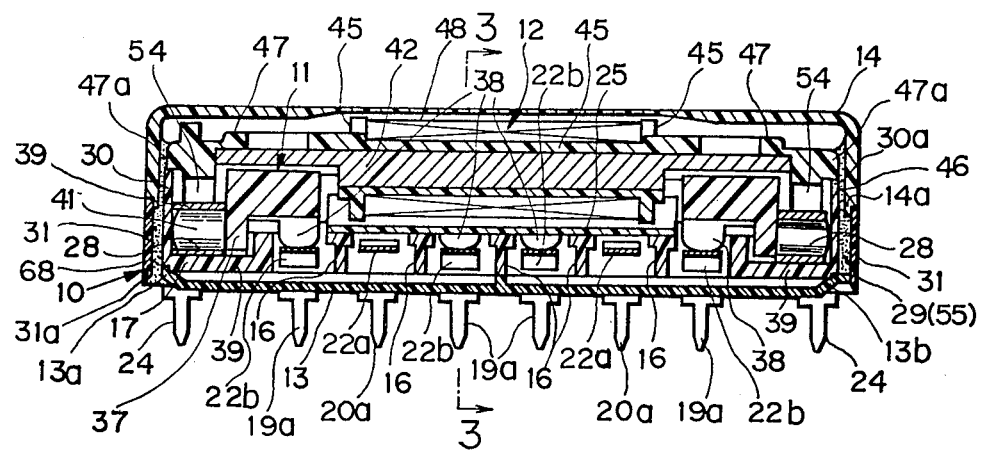
FIG. 2 is a side assembled sectional view showing the electromagnetic relay of FIG. 1.
Figure 3:
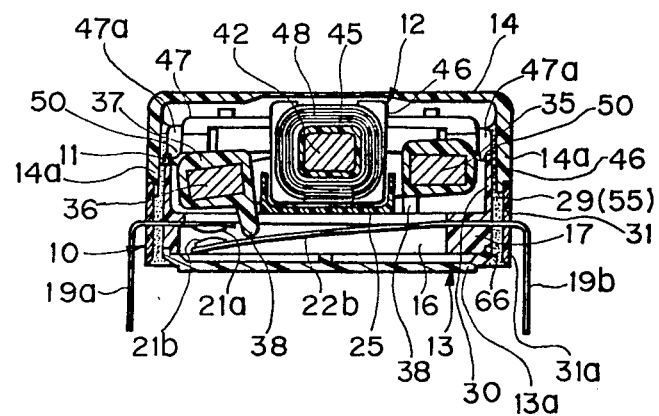
FIG. 3 is a front sectional view taken along the line 3—3 of FIG. 2.

In FIGS. 1 to 5 the base member 10 is a single insulating molded plastic member which is generally shaped like a box. The base member 10 includes a bottom wall 17 which has a plurality of elongated openings 15 and insulating walls 16 downwardly extending therefrom, and a double-wall lateral structure which consists of an inner wall 30 and an outer wall 31. The inner and outer walls 30 and 31 are vertically extending from the periphery of the bottom wall 17 (FIG. 5) and an opening 29 extending vertically through the entire thickness of the base member 10 (FIG. 3). In the base member 10 is inserted normally-open contact connecting terminals 19a and 19b, normally-closed contact connecting terminals 20a and 20b, and four coil connecting terminals 24, which are arranged in a dual-in-line package configuration (as illustrated in FIGS. 1 to 4). As illustrated most particularly in FIGS. 2 and 3, each normally-open contact connecting terminal 19a is connected with a stationary contact 21a, and its opposite terminal 19b is connected with a movable blade 22b carrying a movable contact 21b. The normally-closed contact connecting terminals 20a and 20b are respectively connected to movable contacts (not shown) through movable blades 22a and stationary contacts 23b. The respective movable blades 22a and 22b are arranged between corresponding insulating walls 16. On the walls 16 there is mounted an insulating plate 25.

As illustrated most specifically in FIGS. 1 and 2, the inner wall 30 at the longitudinally opposite portions 30a thereof has a pair of arcuate recesses 28 for accommodating journals 39, four upwardly extending projections 34 for passing through holes 53 formed in the electromagnet 12, and connectors 24a upwardly extending from coil connecting terminals 24.

The armature 11 is an insert-molded element comprising a permanent magnet bar 35 and an iron yoke 36 embedded in parallel within a synthetic resin matrix 37, and carries a pair of drive stub shafts 41 and a plurality of projections 38 for depressing the relatively resilient movable blades 22a or 22b when the electromagnet 12 is disenergized or energized. The armature 11, with journals 39 affixed to its shaft 41, is mounted on the base member 10 for rocking movement in such a manner that the journals 39 are accommodated in said arcuate recesses 28 of the base member 10.

The electromagnet 12 is an insert-molded element consisting of an I-shaped iron bar core 42 is embedded in a similarly shaped synthetic resin matrix 47, the central portion of the matrix 47 forming a spool 45 supporting a coil winding 48. The matrix 47 has a pair of flanges 47a around a peripheral portion thereof.

The electromagnet 12 is mounted on the base member 10 which accommodates the insulating plate 25 and the armature 11 with journals 39. Holes 53 formed in the flanges 47a are pierced by projections 34. The flanges 47a are fitted onto and supported by upper portions of the inner wall 30, including portions 30a, surrounding the base member 10. Both ends of the matrix 47 at its intermediate portions have projections 54 downwardly extending therefrom so as to fix journals 39 to arcuate recesses 28 of the base member 10. Thus, the electromagnet 12 is secured to the base member 10 fixedly in position. Leads 48a of the coil winding 48 are soldered to connectors 24a of coil terminals 24. The coil winding 48 at a lower portion thereof is accommodated by insulating plate 25 as shown in FIG. 3.

The upper cover 14 is shaped like a box having a bottom opening, and has a stepped projection 14a extending downwardly of its periphery. The stepped projection 14a is fitted into the opening 29 between inner and outer walls 30 and 31, whereby the cover 14 is supported by an upper portion of outer wall 31. The inner and outer walls 30 and 31 are molded in such a manner that the inner wall 30 is higher than the outer wall 31 and there is provided a clearance 46 between inner wall 30 and an inside surface of each side wall of upper cover 14, whereby the cover 14 may be easily mounted on the insert-molded base member 10. When the cover 14 is mounted on the member 10, the bottom end 14a of the cover 14 is guided by inner wall 30, so that the cover can be easily fitted into clearance 46 between inside and outside walls 30 and 31.

Figure 4:
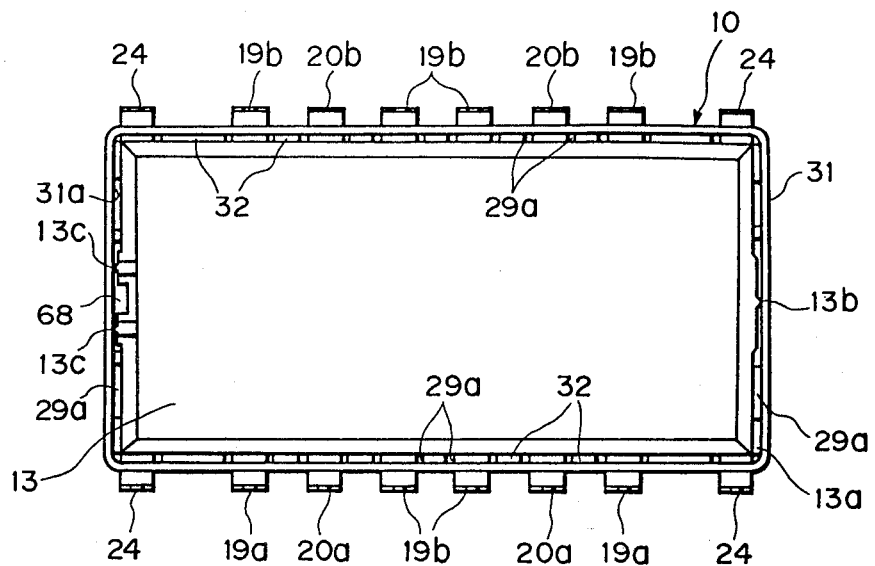
FIG. 4 is a bottom assembled plan view of the relay which is illustrated in FIG. 1 but prior to the sealing operation, as viewed from the bottom side.
Figure 6:
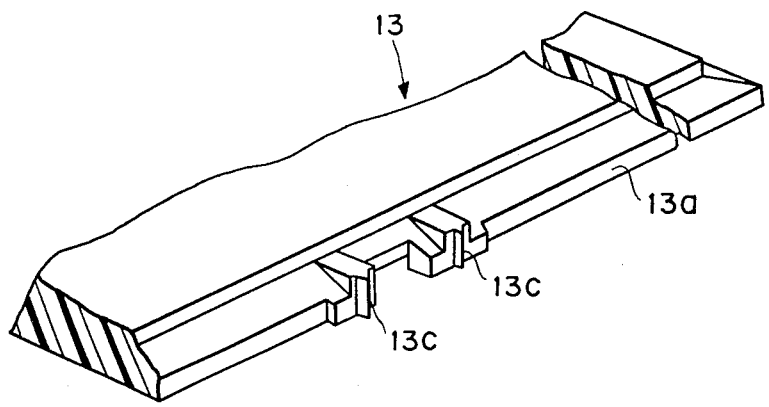
FIG. 6 is a fragmentary perspective view showing a lower cover of the relay of FIG. 1 as viewed from the bottom side.

A lower surface of the bottom wall 17 is covered with the lower cover 13 leaving the opening 29 exposed to the atmosphere. In other words, a bottom recess formed by lower side walls of the bottom wall 17 is closed by lower cover 13. As shown in FIGS. 4 and 6, the lower cover 13 has a sloping peripheral edge 13a, a projection 13b, and a pair of partitioning wall members 13c extending outwardly of its periphery over said opening 29. As the lower cover 13 has been mounted on the reverse side of the bottom wall 17, the peripheral edge 13a and a bottom portion 31a of the outer wall 31 provide a channel 66 for injection of a sealant. Further, the projection 13b and wall members 13c outwardly push respective inner side surfaces of the outer wall 31 at the lower portion 31a, and the channel 66 is partitioned by wall members 13c forming a vent 68 for gasses that are evolved in the sealing operation.

Figure 5:
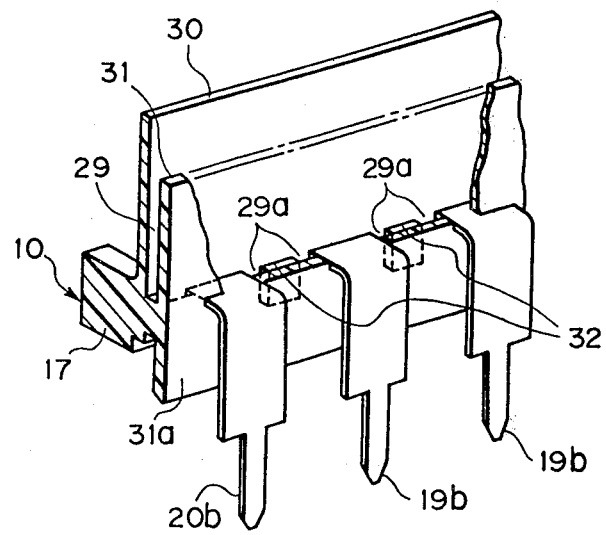
FIG. 5 is a fragmentary perspective view illustrating a construction of a base of the relay of FIG. 1 as viewed from the right-hand side.

After the lower cover 13 was mounted onto the base member 10, a sealant 55 is filled into the opening 29 through the channel 66 from the reverse side of the base member 10. As shown in FIGS. 4 and 5, a plurality of ribs 32 are interposed at intervals between inner and outer walls 30 and 31 along the periphery of the bottom wall 17, whereby the outer wall 31 is firmly supported by the inner wall 30 through ribs 32 allowing the opening 29 to extend vertically through gaps 29a between ribs 32. Therefore, the sealant 55, e.g. epoxy resin, infiltrates from the tapered channel 66 through gaps 29a into the clearance 46, allowing the respective terminals 19a, 19b, 20a, 20b and 24 which are exposed to the opening 29 to be sealed with the sealant 55. The infiltrating sealant 55 further fills a clearance between flanges 47a and side walls of the upper cover 14 as shown in FIGS. 2 and 3, and is allowed to cure in situ. Then, the lower cover 13 is secured to the bottom wall 17, the respective base portions of terminals are airtightly surrounded by sealant 55, the upper cover 14 is airtightly secured to the inner and outer walls 30 and 31, and the flanges 47a or electromagnet 12 is firmly secured to the base member 10. Thus, the upper cover 14, the electromagnet 12, each connecting terminal and the lower cover 13 are simultaneously secured together in position and airtightly sealed. The gasses evolved from the sealant 55 within the relay on curing are evacuated through vent 68. Then, the vent 68 is filled with a sealant to complete the sealing operation. Since the vent 68 is inwardly extending from the bottom surface of the cover 13, the sealant filled into the vent 68 does not migrate downwardly of the bottom surface of the assembled relay.

The projection 13b and the partitioning wall members 13c may be disposed on the inner surface of the lower portion 31a of outer wall 31, instead of the peripheral of the lower cover 13.

In the above-mentioned sealing operation for filling the opening 29 with the sealant 55, the sealant tends to infiltrate into the inside of the inner wall 30, but is blocked by projections 50 formed below the bottom surface of the flanges 47a, whereby the movement of the armature 11 is not hindered by the sealant. The sealant 55 adheres to exposed surfaces of all the connecting terminals 19a, 19b, 20a, 20b, and 24, so that no clearance is left over around each terminal and a perfect seal is established. That is to say, when the terminals of this relay are subsequently soldered to a printed circuit board, for instance, the soldering flux is prevented from entering the inside of the relay. If terminals are simply insert-molded with a resin base, small gaps tend to be created between the resin and terminals, but the formation of such gaps is completely precluded in this invention.

The electromagnetic relay thus constructed functions in such a manner that when the coil terminals 24 are connected to a power supply, the electromagnet 12 is energized to drive the armature 11 so as to establish an electric connection between the confronting normally-open terminals 19a and 19b or break the connection between the confronting normally-closed terminals 20a and 20b. That is to say, the armature 11 rotates clockwise and the projections 38 arranged on the left-hand side in FIG. 3 release the respective biased movable blades 22b or the projections 38 on the right-hand side depress the respective movable blades 22a. When the electromagnet 12 is disenergized, the armature 11 moves counterclockwise and returns to its original status shown in FIG. 3.

Figure 7:
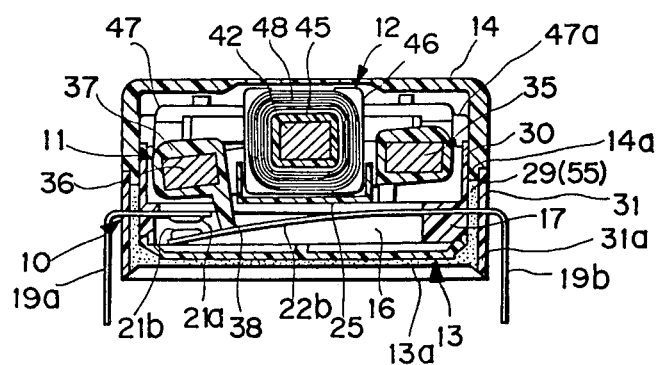
FIG. 7 is a front sectional view of an electromagnetic relay as a modification of the embodiment of FIG. 1.

The electromagnetic relay according to the present embodiment may be modified as schematically illustrated in FIG. 7. That is to say, the upper cover 14 may be modified in such a manner that the bottom end 14a thereof is fitted into the opening 29 without any clearance between side wall of the cover 14 and inner wall 30. In this modified relay, however, the electromagnet 12 is not secured to the base member 10 by the sealant 55, but secured by projections 34 which pass through holes 53 and are welded to the flanges 47a. Moreover, the outer wall 31 may be modified in such a manner that the bottom portion 31a of the outer wall 31 is downwardly extending below the bottom surface 13a of the bottom cover 13, viz. a substantial bottom surface of the base member 10, so as to provide a recess 130 for pooling the sealant 55. The sealant 55 covers the bottom surface 13a of the cover 13 and fills the opening 29, but does not migrate below the bottom end of the outer wall 31, whereby the relay may be stably mounted on a printed circuit board, for instance, without any jutting sealant contacting the board. This sealing operation is advantageous for an electric assembly which is relatively small in dimensions because sealing is performed with a small amount of sealant in a simple operation. It will be apparent that the lower cover (13), terminals, base member and upper cover (14) are secured together by the single sealing operation.

The electromagnetic relay of FIG. 1 may be further modified in such a manner that the lower cover 13 and the bottom wall 17 of the base member 10 are molded as a single unit before assembling. That is to say, the bottom surface of the insert-molded base member carrying external connecting terminals has no opening except for being filled with a sealant. Moreover, if desired, the number of ribs 32 may be decreased in accordance with the dimensions or the mechanical strength of the base member 10.

It will be apparent from the foregoing that the electric assembly described in the above embodiments may be applied to any sealed electric assembly carrying external terminals for its connections, such as a dual-in-package type manual switch or the like.

It should be understood that the above description is merely illustrative of the present invention and that many changes and modifications may be made by those skilled in the art without departing from the scope of the appended claims.

What is claimed is:

1. Electric assembly including an insert-molded base member carrying connecting terminals, an electric block member mounted on said base member, and an upper cover fitted onto said base member to cover said electric block member, said base member comprising inner and outer walls which therebetween form an opening extending vertically through the entire thickness of the base member in such a manner that a lower portion of said upper cover and intermediate portions of said connecting terminals are exposed to said opening, said opening being filled with a sealant from a bottom side thereof to thereby seal and secure in position said upper cover, connecting terminals and base member.

2. Electric assembly according to claim 1, wherein a plurality of ribs are interposed between said inner and outer walls.

3. Electric assembly according to claim 1, wherein said electric block member comprises an electromagnet having a flange around a peripheral portion thereof and an armature for rocking movement, said flange being supported by said inner wall and providing a clearance with respect to an inner surface of said upper cover, said clearance being filled with said sealant so that said electromagnet, upper cover and connecting terminals may be sealed and secured together in position.

4. Electric assembly according to claim 1, wherein said base member has a bottom cover configured to permit filling said sealant into said opening.

5. Electric assembly according to claim 4, wherein said bottom cover comprises a pair of partitioning wall members extending outwardly of its periphery over said opening, said wall members taken together with a confronting portion of said outer wall, forming a vent means for gases evolved in a sealing operation.

6. Electric assembly according to claim 1, wherein said outer wall is downwardly extending below a substantial bottom surface of said base member so as to provide a recess, said recess being filled with said sealing agent.

* * * * *